(12) United States Patent
Xu et al.

(10) Patent No.: US 11,393,511 B2
(45) Date of Patent: Jul. 19, 2022

(54) LIMITING REGULATOR OVERSHOOT DURING POWER UP

(71) Applicant: Micron Technology, Inc., Boise, ID (US)

(72) Inventors: Fei Xu, Shanghai (CN); Dong Pan, Boise, ID (US); Wei Lu Chu, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/114,321

(22) Filed: Dec. 7, 2020

(65) Prior Publication Data
US 2022/0180909 A1 Jun. 9, 2022

(51) Int. Cl.
| | | |
|---|---|---|
| *G11C 7/14* | (2006.01) | |
| *G11C 7/10* | (2006.01) | |
| *G11C 16/34* | (2006.01) | |
| *G11C 16/30* | (2006.01) | |
| *G11C 5/14* | (2006.01) | |

(52) U.S. Cl.
CPC .............. *G11C 7/14* (2013.01); *G11C 5/14* (2013.01); *G11C 5/147* (2013.01); *G11C 7/1051* (2013.01); *G11C 7/1078* (2013.01); *G11C 16/30* (2013.01); *G11C 16/34* (2013.01)

(58) Field of Classification Search
CPC ....... G11C 7/14; G11C 7/1051; G11C 7/1078; G11C 16/30; G11C 16/34; G11C 5/14; G11C 5/147
USPC ........................................................ 365/226
See application file for complete search history.

(56) References Cited

U.S. PATENT DOCUMENTS 9,812,958 B2 * 11/2017 Utsunomiya ......... H02M 3/158

* cited by examiner

*Primary Examiner* — Son L Mai
(74) *Attorney, Agent, or Firm* — Holland & Hart LLP (57) ABSTRACT

Methods, systems, and devices for limiting regulator overshoot during power up are described. In some examples, a memory device may generate a first voltage at a first input node of an amplifier of a memory device based on an application, by an external supply, of a second voltage to a terminal of the memory device. The memory device may generate a third voltage at a second node of the amplifier at an amplifier at an offset to the first voltage, where the second node is coupled with a first gate of a first cascode transistor and a second gate of a second cascode transistor. The memory device may activate the amplifier based on generating the third voltage at the second node of the amplifier.

20 Claims, 7 Drawing Sheets

LIMITING REGULATOR OVERSHOOT DURING POWER UP

FIELD OF TECHNOLOGY

The following relates generally to one or more systems for regulating an internally-generated supply voltage and more specifically to limiting regulator overshoot during power up.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

In some examples, a memory device may use a reference amplifier to amplify a reference voltage to be used in one or more operations at a memory array. The reference amplifier may be driven using multiple power supplies. For instance, a first power supply used for a set of cascode transistors (e.g., configured to provide voltage protection) in the reference amplifier may be different from a second power supply used in generating a reference voltage at the input of the reference amplifier. In some examples, there may be a delay between when each of the power supplies are activated. Due at least partially to this delay, a voltage at the output node of the reference amplifier may experience overshoot.

To mitigate or prevent overshoot from occurring, the voltage being used for the set of cascode transistors and the voltage at the input of the reference amplifier may be derived from a common power supply. For instance, the voltage at the set of cascode transistors may be generated with reference to the voltage at the input of the reference amplifier. By being derived from the common supply, the delay between when the voltage at the input of the reference amplifier is generated and when the voltage at the set of cascode transistors is generated may be lessened and overshoot may be mitigated or prevented.

Features of the disclosure are initially described in the context of systems and dies as described with reference to FIGS. 1 and 2. Features of the disclosure are described in the context of amplifier schematic, timing diagram, and an amplifier configuration as described with reference to FIGS. 3-5. These and other features of the disclosure are further illustrated by and described with reference to an apparatus diagram and flowcharts that relate to limiting regulator overshoot during power up as described with reference to FIGS. 6-7.

Figure 1:
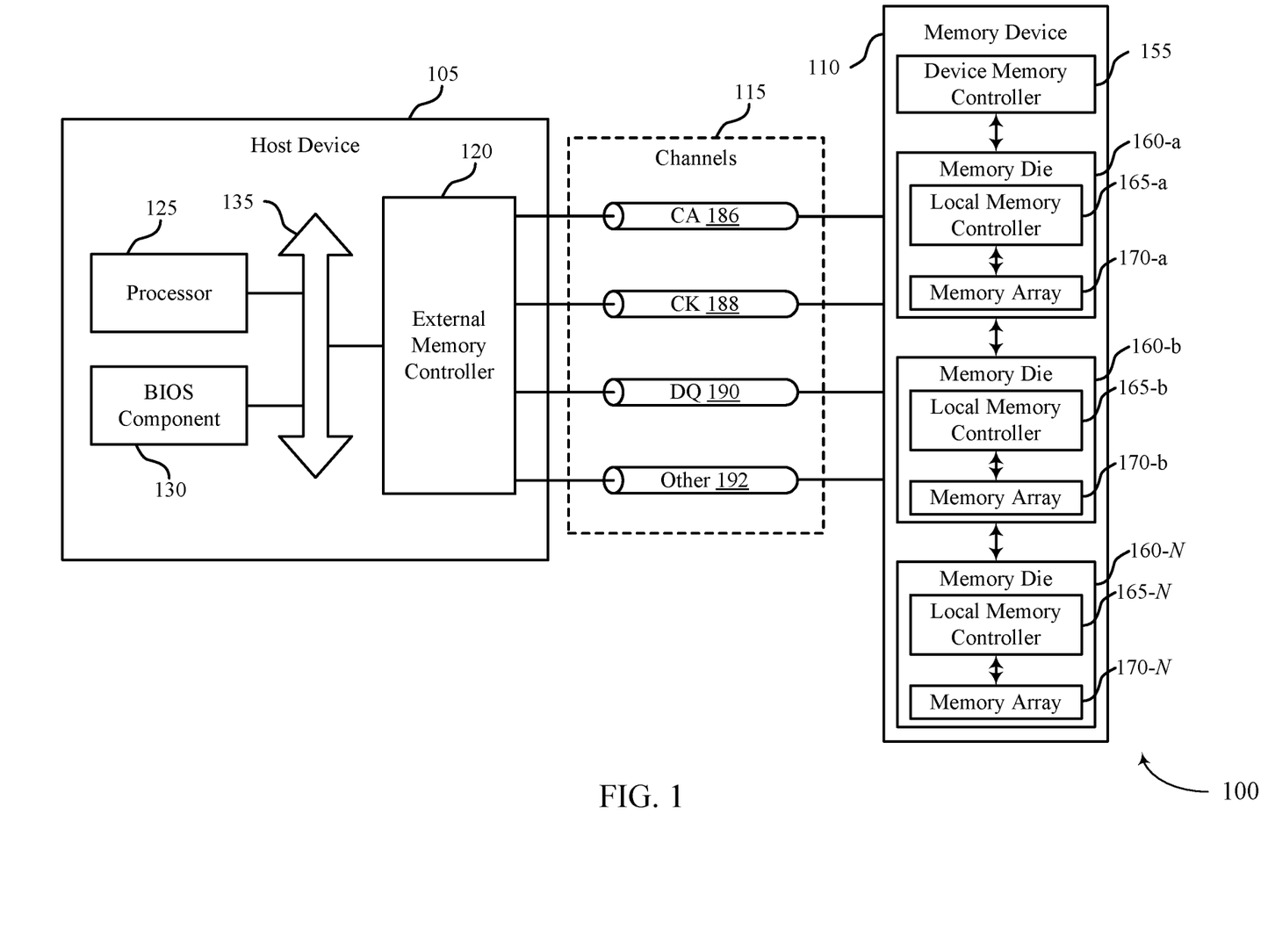
FIG. 1 illustrates an example of a system that supports limiting regulator overshoot during power up in accordance with examples as disclosed herein.

FIG. 1 illustrates an example of a system 100 that supports limiting regulator overshoot during power up in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, a memory device 110 may use a reference amplifier to amplify a reference voltage used in one or more operations at a memory array 170. The reference amplifier may be driven using multiple power supplies. For instance, a first power supply used for a set of cascode transistors (e.g., configured to provide voltage protection) in the reference amplifier may be different from a second power supply used in deriving a reference voltage at the input of the reference amplifier. In some examples, there may be a delay between when each of the power supplies are activated. Due at least partially to this delay, a voltage at the output node of the reference amplifier may experience overshoot.

To mitigate or prevent overshoot from occurring, the voltage being used for the set of cascode transistors and the voltage at the input of the reference amplifier may be derived from a common power supply. For instance, the voltage at the set of cascode transistors may be generated with reference to the voltage at the input of the reference amplifier. By being derived from the common supply, the delay between when the voltage at the input of the reference amplifier is generated and when the voltage at the set of cascode transistors is generated may be lessened and overshoot may be mitigated or prevented.

Figure 2:
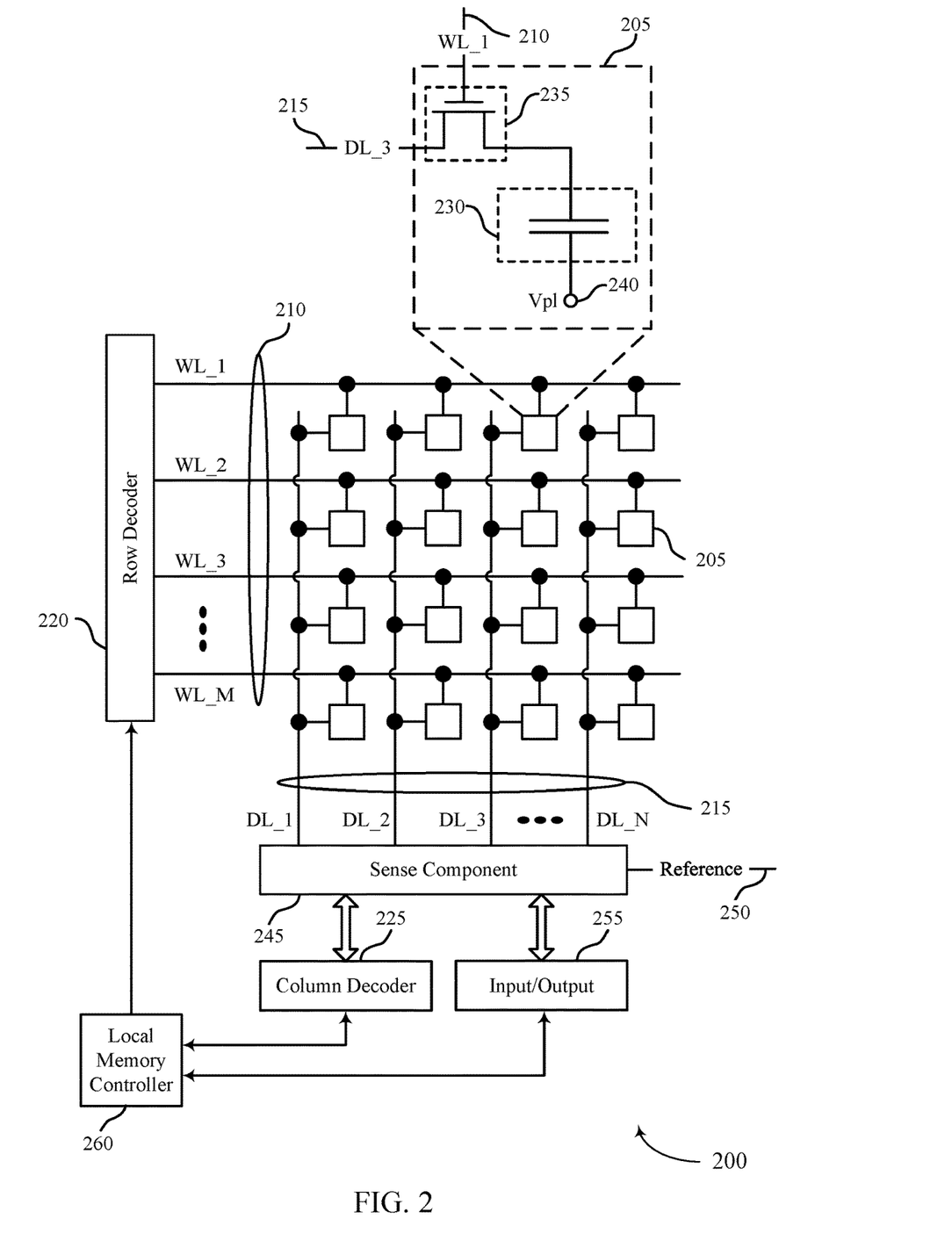
FIG. 2 illustrates an example of a memory die that supports limiting regulator overshoot during power up in accordance with examples as disclosed herein.

FIG. 2 illustrates an example of a memory die 200 that supports limiting regulator overshoot during power up in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading and writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

In some examples, the memory die 200 may be coupled with a reference amplifier. In some examples, the reference amplifier may amplify a reference voltage used in one or more operations at a memory array of memory die 200. For instance, the reference amplifier may provide a reference voltage (e.g., a cell plate reference voltage) to one or more components of the memory array (e.g., to the capacitor 230 via the voltage source 240). The reference amplifier may be driven using multiple power supplies. For instance, a first power supply used for a set of cascode transistors (e.g., cascodes configured to provide voltage protection) in the reference amplifier may be different from a second power supply used in deriving a reference voltage at the input of the reference amplifier. In some examples, there may be a delay between when each of the power supplies are activated. Due at least partially to this delay, a voltage at the output node of the reference amplifier may experience overshoot.

To mitigate or prevent overshoot from occurring, the voltage being used for the set of cascode transistors and the voltage at the input of the reference amplifier may be derived from a common power supply. For instance, the voltage at the set of cascode transistors may be generated with reference to the voltage at the input of the reference amplifier. By being derived from the common supply, the delay between when the voltage at the input of the reference amplifier is generated and when the voltage at the set of cascode transistors is generated may be lessened and overshoot may be mitigated or prevented.

Figure 3:
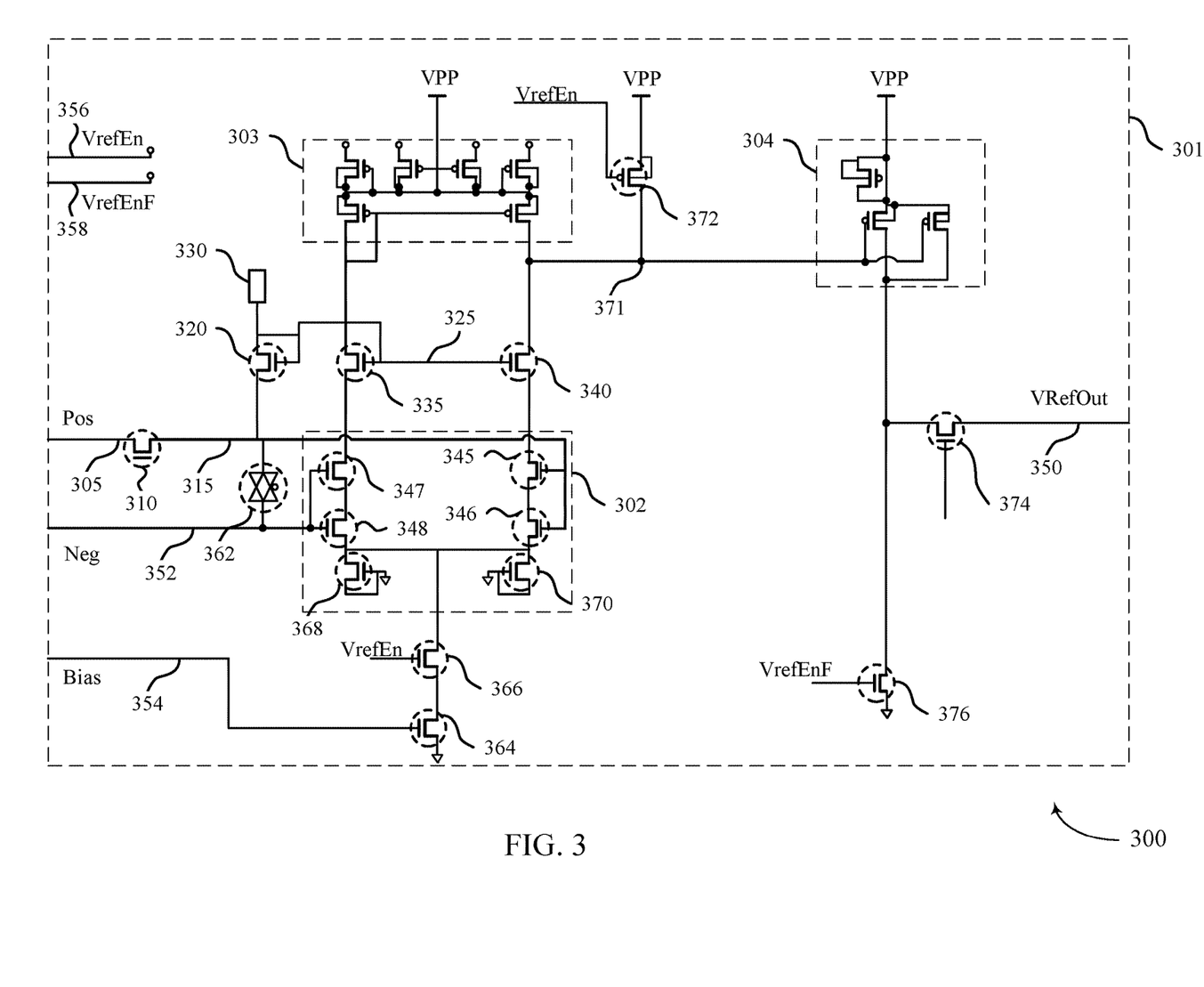
FIG. 3 illustrates an example of an amplifier schematic that supports limiting regulator overshoot during power up in accordance with examples as disclosed herein.

FIG. 3 illustrates an example of an amplifier schematic 300 that supports limiting regulator overshoot during power up in accordance with examples as disclosed herein. Amplifier schematic 300 may illustrate an example of a reference amplifier 301 configured to amplify a reference voltage for use by a memory device (e.g., a DRAM memory device) to perform one or more operations at a memory array (e.g., a memory array 170 as described with reference to FIG. 1).

The reference amplifier 301 may include an input node 305 (e.g., a positive terminal of the reference amplifier 301). Input node 305 may be coupled with a first terminal of first transistor 310, where a second terminal of the first transistor 310 is coupled with a first amplifier node 315. First amplifier node 315 may be coupled with a first terminal of pass gate 362, where a second terminal of the pass gate 362 may be coupled with negative input 352 (e.g., a negative terminal of the reference amplifier 301). First amplifier node 315 and negative input 352 may be coupled with input stage 302.

In some examples, the first transistor 310 and/or the pass gate 362 may operate to enable or disable the reference amplifier 301. For instance, to disable the reference amplifier 301, the first transistor 310 may be deactivated (e.g., which may isolate input node 305 from first amplifier node 315). Additionally or alternatively, to disable the reference amplifier 301, the pass gate 362 may be operated to couple first amplifier node 315 with negative input 352, which may clamp first amplifier node 315 and the negative input 352 together. To enable the reference amplifier, the first transistor 310 may be activated and/or the pass gate 362 may be operated to isolate first amplifier node 315 from negative input 352. Additionally or alternatively, first transistor 310 may operate as a protection device, where a gate of the first transistor 310 is coupled with a power supply used by reference amplifier 301.

In some examples, reference amplifier 301 may include bias input 354 (e.g., a terminal of reference amplifier 301 for applying a bias voltage). Bias input 354 may be coupled with a first terminal of transistor 364 (e.g., at a gate of transistor 364). A second terminal of transistor 364 may be coupled with ground and a third terminal of transistor 366 may be coupled with a first terminal of transistor 366 (e.g., one of a source or drain of transistor 366). The second terminal of transistor 366 may be coupled with input stage 302. In some examples, reference amplifier may include enable inputs 356 (e.g., VrefEn) and 358 (e.g., VrefEnF). For example, enable input 358 may be an inverted polarity of enable input 356.

In some examples, transistor 364 may be configured to set and provide a bias current to transistor 366 (e.g., and input stage 302 in examples where transistor 366 is activated). For instance, the value of the bias current provided by transistor 364 may depend, at least in part, on a voltage applied to bias input 354. In some examples, the transistor 366 may operate to disable biasing at the reference amplifier 301. For instance, if the transistor 366 is activated, a bias current may pass through transistor 366 (e.g., biasing may be enabled). However, if transistor 366 is disabled, the bias current may not pass through transistor 366 (e.g., biasing may be disabled).

Input stage 302 may include transistors 345, 346, 347, 348, 368, and 370. A first terminal of transistor 345 (e.g., a gate of transistor 345) and a first terminal of transistor 346 (e.g., a gate of transistor 346) may be coupled with the first amplifier node 315. In some examples, a second terminal of transistor 345 (e.g., one of a source or drain of transistor 345) may be coupled with a second terminal of transistor 346 (e.g., one of a source or drain of transistor 346). A third terminal of transistor 345 (e.g., the other of the source or drain of transistor 345) may be coupled with an output of input stage 302. A first terminal of transistor 347 (e.g., a gate of transistor 347) and a second terminal of transistor 348 (e.g., a gate of transistor 348) may be coupled with negative input 352. In some examples, a second terminal of transistor 347 (e.g., one of a source or drain of transistor 347) may be coupled with a second terminal of transistor 348 (e.g., one of a source or drain of transistor 348). A third terminal of transistor 347 (e.g., the other of the source or drain of transistor 347) may be coupled with an output of input stage 302. A third terminal of transistor 346 (e.g., the other of the source or drain of transistor 346) and a third terminal of transistor 348 (e.g., the other of the source or drain of transistor 348) may be coupled to a first terminal of transistor 368 (e.g., one of a source or drain of transistor 368) and a first terminal of transistor 370 (e.g., one of a source or drain of transistor 370). A second and third terminal of transistor 368 (e.g., the other of the source or drain of transistor 368 and a gate of transistor 368) may be coupled to ground. A second and third terminal of transistor 370 (e.g., the other of the source or drain of transistor 368 and a gate of transistor 370) may be coupled to ground. In some examples, transistors 368 and/or 370 may be configured to provide protection for input stage 302.

In some examples of input stage 302, transistors 368 and 370 may not be included. In such examples, transistors 348 and/or 346 may be coupled with transistor 366. Additionally or alternatively, transistors 346 and 348 may not be included. In such examples, the second terminal of transistors 345 and/or 347 may be coupled with transistor 366. When transistors 346 and/or 348 are included, as depicted herein, transistors 345 and 346 and/or 347 and 348 may be in a cascode input arrangement.

In some examples, first amplifier node 315 may be coupled with a first terminal of switching device 320 (e.g., a transistor, a diode). The switching device 320 may be coupled (e.g., via a second terminal and/or a third terminal of the switching device 320) with a second amplifier node 325. In some examples, the first terminal of the switching device 320 may be one of a source or drain of the switching device 320, the second terminal of the switching device 320 may be the other of the source or drain of the switching device 320, and the third terminal of the switching device 320 may be a gate of the switching device 320. The gate and the second terminal of the switching device 320 may be coupled together (e.g., to the second amplifier node 325). The switching device 320 may be an n-type FET, for example. The second amplifier node 325 may be coupled with a current generator 330, a gate of a first cascode transistor 335, and a gate of a second cascode transistor 340. The first cascode transistor 335 may be coupled with the third terminal of transistor 347 (e.g., the other of the source or drain of the transistor 347) second cascode 340 may be coupled with the third terminal of a transistor 345 (e.g., the other of the source or drain of the transistor 345).

The first transistor 310 may be configured to selectively couple the input node 305 and the first amplifier node 315. The switching device 320 may be configured to provide a voltage at the second amplifier node 325 that is at an offset to the voltage at the first amplifier node 315. The current generator 330 may be configured to supply a current to the second amplifier node 325. In some examples, the switching device 320 may be configured to provide the voltage at the second amplifier node 325 based on the current generator supplying the current to the second amplifier node 325. For instance, the current generator 330 may provide a current that forward biases switching device 320 to provide the voltage offset between first amplifier node 315 and second amplifier node 325. As input node 305 and/or first amplifier node 315 are supplied by a reference voltage used to supply one or more other circuits, the current output by current generator 330 may be negligible due to the current being generated by or input into current sources that may sink the current without changing the reference voltage at input node 305 and/or the first amplifier node 315 by an amount greater than a threshold.

The first cascode transistor 335 and the second cascode transistor 340 may be configured to provide voltage protection for the reference amplifier 301. In some examples, including the first cascode transistor 335 and the second cascode transistor 340 may improve a gain response of reference amplifier 301 (e.g., may increase a speed of adjustment to output load by amplifier 301). In some examples, some or each of the components described herein may be operated to provide an amplified reference voltage (e.g., an amplified version of the reference voltage provided to input node 305) to output node 350 (e.g., VRefOut) 350. Further details may be described herein, for instance, with reference to FIG. 4.

Reference amplifier 301 may include a current mirror stage 303. Current mirror stage 303 may be supplied by an external voltage (e.g., VPP) and may be coupled with a terminal (e.g., a source or drain) of first cascode transistor 335 and second cascode transistor 340. Current mirror stage 303 and the terminal of the second cascode transistor 340 may be coupled with a first terminal (e.g., one of a source or drain) of transistor 372 and an output stage 304 of reference amplifier 301. A second terminal (e.g., the other of the source or drain) may be coupled with a voltage supply (e.g., VPP) and the output stage 304 may be coupled with a voltage supply (e.g., VPP).

In some examples, transistor 372 may be configured to prevent reference amplifier 301 from amplifying a voltage when reference amplifier 301 is disabled. For instance, when reference amplifier 301 is disabled, the transistor 372 may be activated and the voltage supply coupled with the second terminal of the transistor 372 may be clamped with the node 371. However, when reference amplifier 301 is enabled, the transistor may be deactivated and the voltage supply may be isolated from node 371. In some examples, the output stage 304 may be configured to output the amplified reference voltage to output node 350 via transistor 374.

Output stage 304 may be coupled with a first terminal (e.g., one of a source or drain) of transistor 374 and a first terminal (e.g., one of a source or drain) of transistor 376. A second terminal (e.g., the other of the source or drain) of transistor 374 may be coupled to output node 350 and a second terminal (e.g., the other of the source or drain) of transistor 376 may be coupled with ground.

In some examples, the transistor 374 may operate to enable an output of reference amplifier 301. For instance, if the transistor 374 is activated, the transistor 374 may couple the output stage 304 with output node 350. However, if transistor 374 is deactivated, the output stage 304 may be isolated from output node 350. In some examples, the transistor 376 may be configured to disable the output stage 304 (e.g., to clamp the output to ground when the reference amplifier 301 is disabled).

Figure 4:
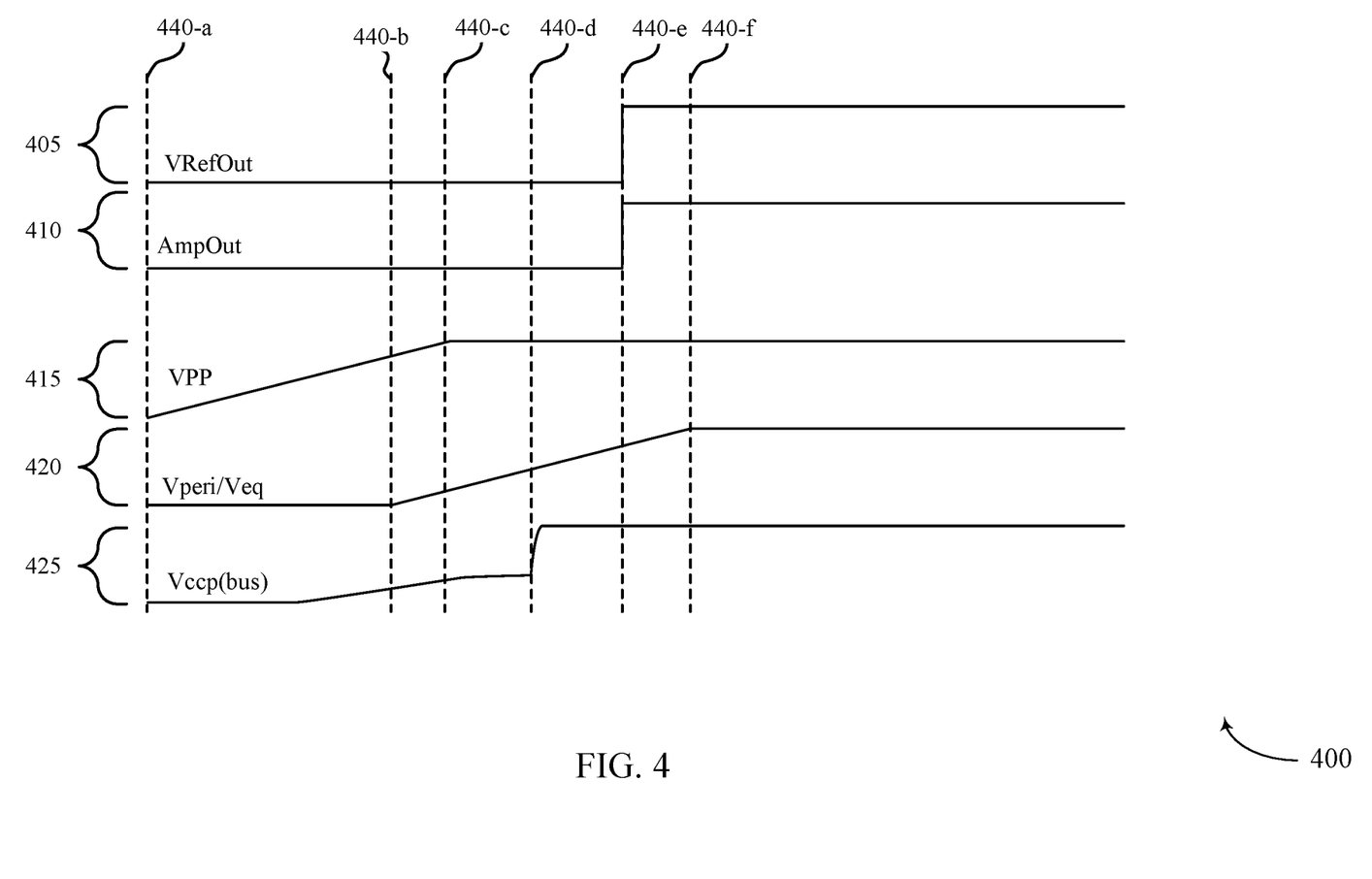
FIG. 4 illustrates an example of a timing diagram that supports limiting regulator overshoot during power up in accordance with examples as disclosed herein.

FIG. 4 illustrates an example of a timing diagram 400 that supports limiting regulator overshoot during power up in accordance with examples as disclosed herein. Timing diagram 400 may illustrate an example of how a reference amplifier 301 may operate to generate an amplified reference voltage at output node 350.

Figure 5:
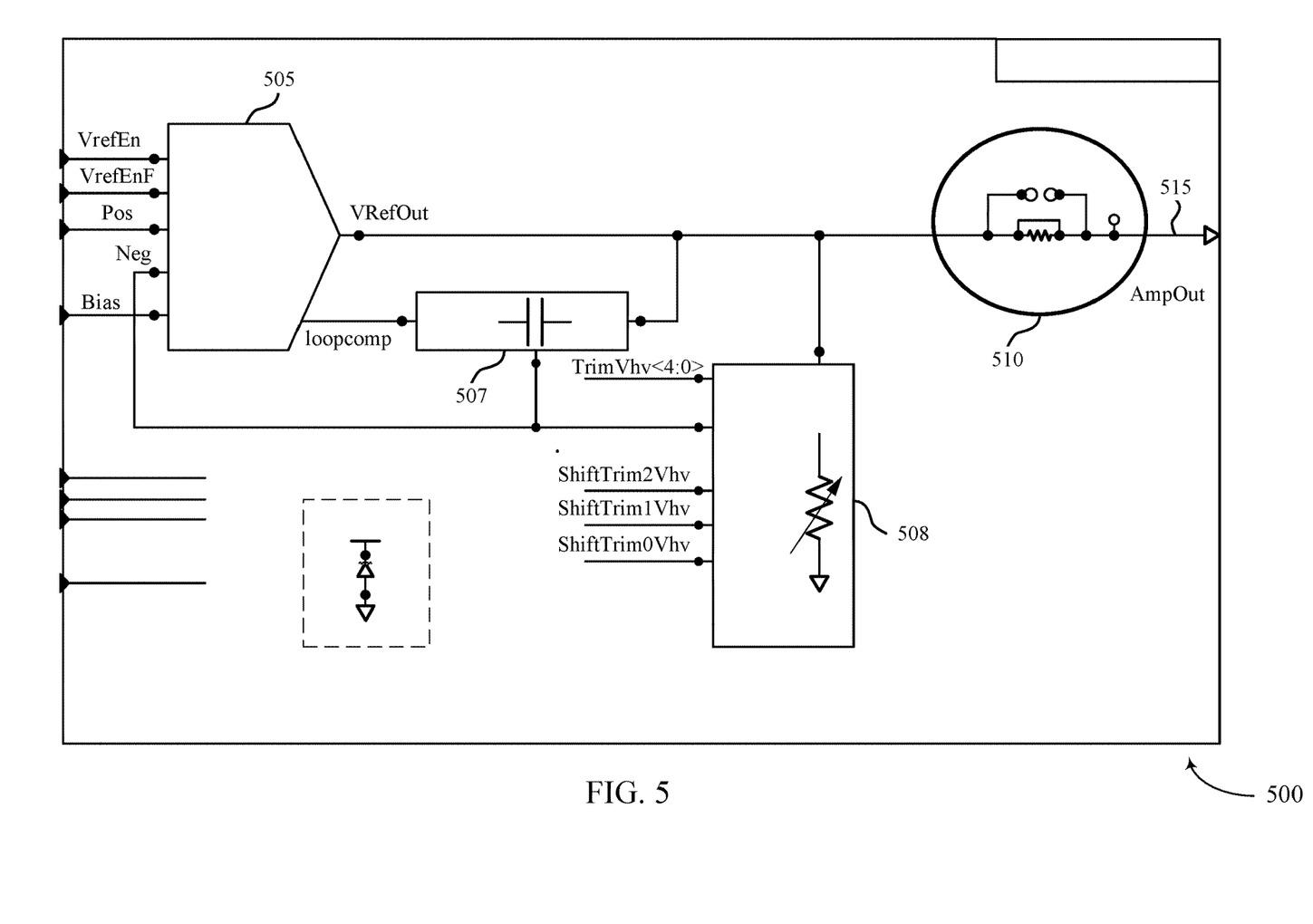
FIG. 5 illustrates an example of an amplifier configuration that supports limiting regulator overshoot during power up in accordance with examples as disclosed herein.

Output voltage 405 may represent an amplified reference voltage generated at output node 350 and voltage 410 may represent a voltage derived from output voltage 405 (e.g., a voltage used for performing one or more operations on a memory array, such as a voltage at AmpOut as depicted in FIG. 5). First supply voltage 415 may represent a voltage provided to the reference amplifier 301 by an external supply (e.g., $V_{pp}$). Second supply voltage 420 may represent a voltage that is applied to circuits peripheral to a memory array of a memory device that includes the reference amplifier 301. In some cases, the second supply voltage 420 may be a lower voltage than the first supply voltage 415. For example, the first supply voltage may nominally be 2.5V while the second supply voltage may nominally be 1.1V. Third supply voltage 425 may represent a voltage applied to a gate of transistor 366, transistor 372, transistor 376, or any combination thereof.

Between 440-a and 440-c, the first supply voltage 415 may transition from a low voltage (e.g., a ground voltage or 0V) to a high voltage (e.g., the nominal voltage of 2.5V). Similarly, between 440-b and 440-f, the second supply voltage 420 may transition from a low (e.g., a ground voltage or 0V) voltage to a high voltage (e.g., the nominal voltage of 1.1V). A delay may be present between when the first supply voltage 415 begins transitioning to the high voltage and when the second supply voltage 420 begins transitioning to the high voltage. For example, the device may be operated according to a set of specifications that allow some delay between transitions of the first supply voltage 415 and the second supply voltage 420, or allow for a range of slew rates that similarly may cause the second supply voltage to reach its nominal voltage after the first supply voltage.

At 440-d, third supply voltage 425 may transition to a high enough voltage that one or more of transistors 366, 372, or 376 are activated or deactivated. For instance, once third supply voltage 425 passes a respective threshold, transistor 366 may be activated, which may couple input stage 302 with transistor 364. Additionally or alternatively, transistor 372 may be deactivated, which may isolate node 371 from the power supply coupled with another terminal of the transistor 372. Additionally or alternatively, transistor 376 may be deactivated, which may enable reference amplifier 301 to output a reference voltage.

At 440-e, voltage 410 and output voltage 405 may transition from respective low voltages to respective high voltages. In some examples, the output voltage 405 and/or voltage 410 transitioning to respective high voltages may be due at least in part based on transistor 374 activating and/or transistor 372 deactivating. The transistor 372 deactivating may enable the output stage 304 to output the amplified reference voltage and transistor 374 activating may enable the amplified reference voltage to be passed to the output node 350. In some examples, voltage 410 and output voltage 405 may begin transitioning from the respective low voltages to the respective high voltages after first supply voltage 415 transitions to the respective high voltage (e.g., reaches a threshold voltage or within a threshold of its nominal voltage) but before the second supply voltage 420 transitions fully to the respective high voltage.

In some examples, the gate of the first cascode transistor 335 and the gate of the second cascode transistor 340 may be coupled with a supply providing the second supply voltage 420 (not shown). In such examples, the switching device 320 and/or the current generator 330 may not be present. As such, the gates of the first cascode transistor 335 and the second cascode transistor 340 may be isolated from the first amplifier node 315. In such examples, at 440-e, as the second supply voltage 420 may not fully have reached the respective high voltage before voltage 410 and output voltage 405 transition, the output voltage 405 may exhibit overshooting behavior. For instance, the output voltage 405 and/or the voltage 410 may transition before the gates of first cascode transistor 335 and the second cascode transistor 340 are biased to or above a threshold amount. In such examples, the current provided by current mirror stage 303 to node 371 may be smaller than a leakage current provided to node 371 by the second cascode transistor 340. Due to the current provided by current mirror stage 303 to node 371 being smaller, the value of the voltage at node 371 may transition to a voltage value low enough to cause an overshoot for output voltage 405. When the output voltage 405 exceeds the respective high voltage value, voltage 410 may also exceed the respective high voltage value. As such, one or more components of the memory array and/or of the memory device including the reference amplifier 301 may experience stress or may be more likely to be damaged.

To prevent overshoot from occurring or to mitigate the amount by which the output voltage 405 experiences overshoot, the switching device 320 and/or the current generator 330 may operate to generate the voltage at the second amplifier node 325 such that the voltage at the second amplifier node 325 is at an offset from the voltage at the first amplifier node 315. In some examples, the voltage at input node 305 may be generated at least in part based on a supply (e.g., an external supply) providing first supply voltage 415. Additionally or alternatively, the voltage at input node 305 may be derived based on a bandgap reference voltage. As such, the voltage at the second amplifier node 325 may also be generated at least in part based on the supply providing first supply voltage 415.

As the voltage at the second amplifier node 325 may be derived based on the first supply voltage 415 and as the first supply voltage 415 may transition to the respective high voltage (e.g., at 440-c) before output voltage 405 begins transitioning to the high voltage, the voltage at the gates of first cascode transistor 335 and second cascode transistor 340 may be at full voltage before output voltage 405 begins transitioning to the high voltage (e.g., at 440-e). As such, overshoot may be prevented or may be at least partially mitigated.

In some examples, the methods and components as described herein may be applicable for reference amplifiers 302 included in DRAM memory devices, SDRAM memory devices, FeRAM memory devices, MRAM memory devices, RRAM memory devices, flash memory, PCM, self-selecting memory, or any combination thereof. Additionally or alternatively, the methods and components as described herein may be applicable for reference amplifiers 302 included in other types of devices. In some examples, the methods and components as described herein may be used to prevent or mitigate overshoot for other types of amplifiers and/or in other circuits (e.g., a circuit that includes cascodes configured for voltage protection).

FIG. 5 illustrates an example of an amplifier configuration 500 that supports limiting regulator overshoot during power up in accordance with examples as disclosed herein.

In some examples, amplifier configuration 500 may be an example of a non-inverting operational amplifier configuration with closed-loop power control. For instance, amplifier configuration may include a reference amplifier 505, which may be an example of a reference amplifier 301 as described with reference to FIG. 3. Performing the closed-loop feedback may involve the use of a loop compensation capacitor 507 and a variable resistance 508. A first terminal of the variable resistance may be coupled with an output terminal of the reference amplifier 505 (e.g., output node 350), a second terminal of the variable resistance may be coupled with ground, and a third terminal of the variable resistance may be coupled with a negative terminal of the reference amplifier (e.g., negative input 352). In some examples, the amplifier gain of reference amplifier 505 may be given by $$G = 1 + \frac{R_f}{R_{in}},$$

where $R_f$ may represent a resistance between the first terminal of the variable resistance 508 and the third terminal of the variable resistance and $R_{in}$ may represent a resistance between the third terminal of the variable resistance and the second terminal of the variable resistance.

When the amplifier configuration 500 does not include resistor 510 (e.g., when the resistor 510 is replaced with a short), a phase cross point may occur relatively close to an area where phase decreases steeply (e.g., with reference to frequency). However, by including resistor 510 in the amplifier configuration 500, the phase cross point may be moved farther away from the area where phase decreases steeply (e.g., with reference to frequency). In some examples, the resistor 510 may be an example of an equivalent series resistance (ESR). In some examples, the resistor 510 may be placed at the output of the reference amplifier 505 or there may be a resistance capacitance (RC) filter before one or more local amplifiers. In some examples, a capacitor may be coupled with node 515 (e.g., the AmpOut node), which may be configured to prevent or mitigate overshoot.

Figure 6:
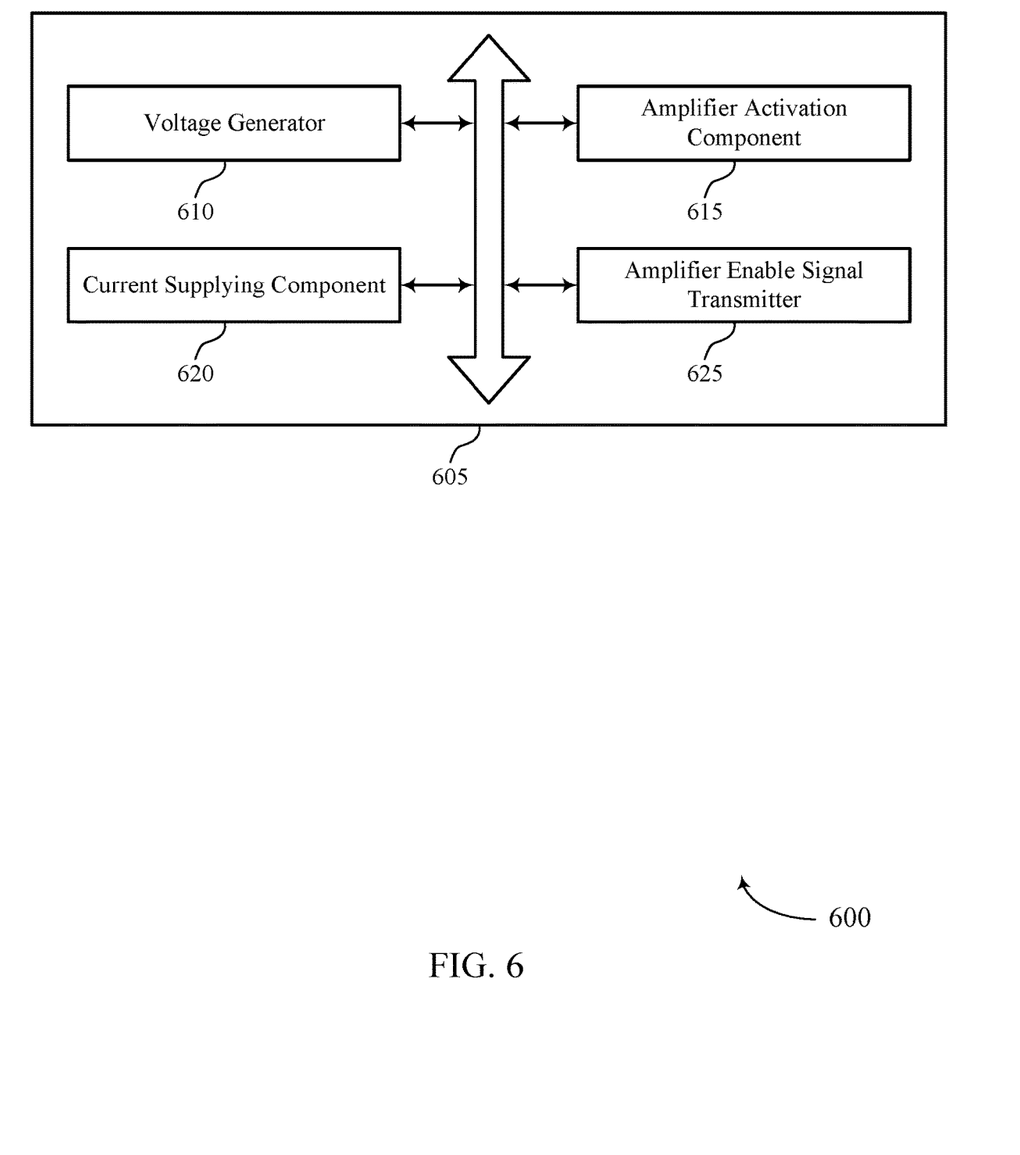
FIG. 6 shows a block diagram of a memory device that supports limiting regulator overshoot during power up in accordance with examples as disclosed herein.

FIG. 6 shows a block diagram 600 of a memory device 605 that supports limiting regulator overshoot during power up in accordance with examples as disclosed herein. The memory device 605 may be an example of aspects of a memory device as described with reference to FIGS. 1 through 5. The memory device 605 may include a voltage generator 610, an amplifier activation component 615, a current supplying component 620, and an amplifier enable signal transmitter 625. Each of these modules may communicate, directly or indirectly, with one another (e.g., via one or more buses).

The voltage generator 610 may generate a first voltage at a first input node of an amplifier of a memory device based on an application, by an external supply, of a second voltage to a terminal of the memory device. In some examples, the voltage generator 610 may generate a third voltage at a second node of the amplifier at an offset to the first voltage, where the second node is coupled with a first gate of a first cascode transistor and a second gate of a second cascode transistor. In some examples, the voltage generator 610 may generate, by the amplifier, a reference voltage based on activating the amplifier, where an overshoot of the reference voltage, a maximum magnitude of the reference voltage, or both is reduced based on generating the third voltage at the second node of the amplifier.

The amplifier activation component 615 may activate the amplifier based on generating the third voltage at the second node of the amplifier.

The current supplying component 620 may supply, by a current generator coupled with the second node, a current to the second node, where generating the third voltage is further based at last in part on supplying the current to the second node.

The amplifier enable signal transmitter 625 may transmit, to the amplifier, a signal configured to enable the amplifier after generating the third voltage at the second node, where activating the amplifier is based on applying the signal after generating the third voltage.

Figure 7:
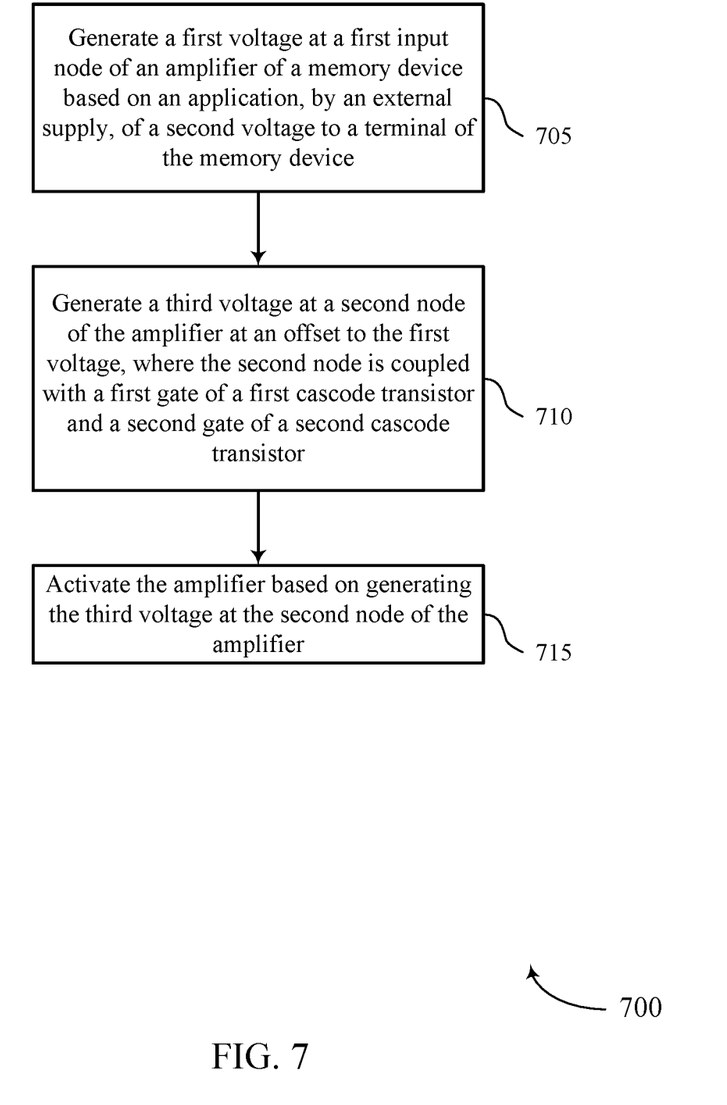
FIG. 7 shows a flowchart illustrating a method or methods that support limiting regulator overshoot during power up in accordance with examples as disclosed herein.

FIG. 7 shows a flowchart illustrating a method or methods 700 that supports limiting regulator overshoot during power up in accordance with examples as disclosed herein. The operations of method 700 may be implemented by a memory device or its components as described herein. For example, the operations of method 700 may be performed by a memory device as described with reference to FIG. 6. In some examples, a memory device may execute a set of instructions to control the functional elements of the memory device to perform the described functions. Additionally or alternatively, a memory device may perform aspects of the described functions using special-purpose hardware.

At 705, the memory device may generate a first voltage at a first input node of an amplifier of a memory device based on an application, by an external supply, of a second voltage to a terminal of the memory device. The operations of 705 may be performed according to the methods described herein. In some examples, aspects of the operations of 705 may be performed by a voltage generator as described with reference to FIG. 6.

At 710, the memory device may generate a third voltage at a second node of the amplifier at an offset to the first voltage, where the second node is coupled with a first gate of a first cascode transistor and a second gate of a second cascode transistor. The operations of 710 may be performed according to the methods described herein. In some examples, aspects of the operations of 710 may be performed by a voltage generator as described with reference to FIG. 6.

At 715, the memory device may activate the amplifier based on generating the third voltage at the second node of the amplifier. The operations of 715 may be performed according to the methods described herein. In some examples, aspects of the operations of 715 may be performed by an amplifier activation component as described with reference to FIG. 6.

In some examples, an apparatus as described herein may perform a method or methods, such as the method 700. The apparatus may include features, means, or instructions (e.g., a non-transitory computer-readable medium storing instructions executable by a processor) for generating a first voltage at a first input node of an amplifier of a memory device based on an application, by an external supply, of a second voltage to a terminal of the memory device, generating a third voltage at a second node of the amplifier at an offset to the first voltage, where the second node is coupled with a first gate of a first cascode transistor and a second gate of a second cascode transistor, and activating the amplifier based on generating the third voltage at the second node of the amplifier.

Some examples of the method 700 and the apparatus described herein may further include operations, features, means, or instructions for generating, by the amplifier, a reference voltage based on activating the amplifier, where an overshoot of the reference voltage, a maximum magnitude of the reference voltage, or both may be reduced based on generating the third voltage at the second node of the amplifier.

Some examples of the method 700 and the apparatus described herein may further include operations, features, means, or instructions for supplying, by a current generator coupled with the second node, a current to the second node, where generating the third voltage may be further based at last in part on supplying the current to the second node.

Some examples of the method 700 and the apparatus described herein may further include operations, features, means, or instructions for transmitting, to the amplifier, a signal configured to enable the amplifier after generating the third voltage at the second node, where activating the amplifier may be based on applying the signal after generating the third voltage.

It should be noted that the methods described herein describe possible implementations, and that the operations and the steps may be rearranged or otherwise modified and that other implementations are possible. Further, portions from two or more of the methods may be combined.

An apparatus is described. The apparatus may include an amplifier of a memory device that includes a first cascode transistor coupled with a first node of the amplifier, a second cascode transistor coupled with the first cascode transistor via the first node of the amplifier, and a switching device coupled with a first gate of the first cascode transistor, a second gate of the second cascode transistor, and coupled with a second input node of the amplifier, where the switching device is configured to generate a first voltage at the first node at an offset of a second voltage applied to the second input node, where the second voltage is associated with a third voltage corresponding to an external supply, and where the amplifier is configured to be activated based on the switching device generating the first voltage at the first node.

In some examples, the amplifier may include a current generator coupled with the switching device via the first node of the amplifier and configured to supply a current to the first node of the amplifier, where the switching device may be configured to generate the first voltage at the first node based on the current generator supplying the current to the first node of the amplifier.

In some examples, the first node may be coupled with a first terminal of the switching device and a second terminal of the switching device, and where the second input node may be coupled with a third terminal of the switching device.

In some examples, the first terminal of the switching device includes one of a source or drain of the switching device, the third terminal of the switching device includes the other of the source or drain of the switching device, and the second terminal of the switching device includes a gate of the switching device.

In some examples, the amplifier may include a transistor coupled with one of a source or drain of the first cascode transistor and the second input node.

In some examples, a gate of the transistor may be coupled with the second input node and one of a source or drain of the transistor may be coupled with the first cascode transistor.

In some examples, the switching device includes a cascode transistor, a transistor, a diode, or any combination thereof.

In some examples, the memory device includes a dynamic random access memory device.

An apparatus is described. The apparatus may include a memory device, where the memory device includes an amplifier that includes a first cascode transistor coupled with a first node of the amplifier of the memory device, a second cascode transistor coupled with the first cascode transistor via the first node of the amplifier, a switching device coupled with a first gate of the first cascode transistor, a second gate of the second cascode transistor via the first node, and a second input node of the amplifier, and a controller coupled with the amplifier and operable to cause the memory device to generate a first voltage at the second input node based on an application, by an external supply, of a second voltage to a terminal of the memory device, where the switching device is configured to generate a third voltage at the first node of the amplifier at an offset to the first voltage and activate the amplifier based on generating the third voltage at the first node of the amplifier.

In some examples, the controller may further be operable to cause the apparatus to: generate, by the amplifier, a reference voltage based on activating the amplifier, where an overshoot of the reference voltage, a maximum magnitude of the reference voltage, or both may be reduced based on generating the third voltage at the first node of the amplifier.

In some examples, the amplifier may further include a current generator coupled with the first node, where the controller is further operable to cause the apparatus to supply, by the current generator, a current to the first node, where generating the third voltage may be further based at last in part on the current generator supplying the current to the first node.

In some examples, the controller may further be operable to cause the apparatus to transmit, to the amplifier, a signal configured to enable the amplifier after generating the third voltage at the first node, where activating the amplifier may be based on applying the signal after generating the third voltage.

In some examples, the first node may be coupled with a first terminal of the switching device and a second terminal of the switching device.

In some examples, the amplifier further includes a transistor coupled with the second input node at a first terminal of the transistor and coupled with a terminal of the first cascode transistor at a second terminal of the transistor.

In some examples, the switching device includes a cascode transistor, a transistor, a diode, or any combination thereof.

In some examples, the memory device includes a dynamic random access memory device.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An amplifier of a memory device, comprising:
   a first cascode transistor coupled with a first node of the amplifier;
   a second cascode transistor coupled with the first cascode transistor via the first node of the amplifier; and
   a switching device coupled with a first gate of the first cascode transistor, a second gate of the second cascode transistor, and coupled with a second input node of the amplifier, wherein the switching device is configured to generate a first voltage at the first node at an offset of a second voltage applied to the second input node, wherein the second voltage is associated with a third voltage corresponding to an external supply, and wherein the amplifier is configured to be activated based at least in part on the switching device generating the first voltage at the first node.

2. The amplifier of claim 1, further comprising:
   a current generator coupled with the switching device via the first node of the amplifier and configured to supply a current to the first node of the amplifier, wherein the switching device is configured to generate the first voltage at the first node based at least in part on the current generator supplying the current to the first node of the amplifier.

3. The amplifier of claim 1, wherein the first node is coupled with a first terminal of the switching device and a second terminal of the switching device, and wherein the second input node is coupled with a third terminal of the switching device.

4. The amplifier of claim 3, wherein the first terminal of the switching device comprises one of a source or drain of the switching device, the third terminal of the switching device comprises the other of the source or drain of the switching device, and the second terminal of the switching device comprises a gate of the switching device.

5. The amplifier of claim 1, further comprising:
   a transistor coupled with one of a source or drain of the first cascode transistor and the second input node.

6. The amplifier of claim 5, wherein a gate of the transistor is coupled with the second input node and one of a source or drain of the transistor is coupled with the first cascode transistor.

7. The amplifier of claim 1, wherein the switching device comprises a cascode transistor, a transistor, a diode, or any combination thereof.

8. The amplifier of claim 1, wherein the memory device comprises a dynamic random access memory device.

9. A memory device, comprising:
   an amplifier, comprising:
   a first cascode transistor coupled with a first node of the amplifier of the memory device;
   a second cascode transistor coupled with the first cascode transistor via the first node of the amplifier;
   a switching device coupled with a first gate of the first cascode transistor, a second gate of the second cascode transistor via the first node, and a second input node of the amplifier; and
   a controller coupled with the amplifier and operable to cause the memory device to:
   generate a first voltage at the second input node based at least in part on an application, by an external supply, of a second voltage to a terminal of the memory device, wherein the switching device is configured to generate a third voltage at the first node of the amplifier at an offset to the first voltage; and
   activate the amplifier based at least in part on generating the third voltage at the first node of the amplifier.

10. The memory device of claim 9, wherein the controller is further operable to cause the memory device to:
    generate, by the amplifier, a reference voltage based at least in part on activating the amplifier, wherein an overshoot of the reference voltage, a maximum magnitude of the reference voltage, or both is reduced based at least in part on generating the third voltage at the first node of the amplifier.

11. The memory device of claim 9, wherein the amplifier further comprises a current generator coupled with the first node, and wherein the controller is further operable to cause the memory device to:
    supply, by the current generator, a current to the first node, wherein generating the third voltage is further based at last in part on the current generator supplying the current to the first node.

12. The memory device of claim 9, wherein the controller is further operable to cause the memory device to:
    transmit, to the amplifier, a signal configured to enable the amplifier after generating the third voltage at the first node, wherein activating the amplifier is based at least in part on applying the signal after generating the third voltage.

13. The memory device of claim 9, wherein the first node is coupled with a first terminal of the switching device and a second terminal of the switching device.

14. The memory device of claim 9, wherein the amplifier further comprises a transistor coupled with the second input node at a first terminal of the transistor and coupled with a terminal of the first cascode transistor at a second terminal of the transistor.

15. The memory device of claim 9, wherein the switching device comprises a cascode transistor, a transistor, a diode, or any combination thereof.

16. The memory device of claim 9, wherein the memory device comprises a dynamic random access memory device.

17. A method, comprising:
    generating a first voltage at a first input node of an amplifier of a memory device based at least in part on an application, by an external supply, of a second voltage to a terminal of the memory device;

generating a third voltage at a second node of the amplifier at an offset to the first voltage, wherein the second node is coupled with a first gate of a first cascode transistor and a second gate of a second cascode transistor; and activating the amplifier based at least in part on generating the third voltage at the second node of the amplifier.

18. The method of claim 17, further comprising:

generating, by the amplifier, a reference voltage based at least in part on activating the amplifier, wherein an overshoot of the reference voltage, a maximum magnitude of the reference voltage, or both is reduced based at least in part on generating the third voltage at the second node of the amplifier.

19. The method of claim 17, further comprising:

supplying, by a current generator coupled with the second node, a current to the second node, wherein generating the third voltage is further based at last in part on supplying the current to the second node.

20. The method of claim 17, further comprising:

transmitting, to the amplifier, a signal configured to enable the amplifier after generating the third voltage at the second node, wherein activating the amplifier is based at least in part on applying the signal after generating the third voltage.

\* \* \* \* \*

UNITED STATES PATENT AND TRADEMARK OFFICE
CERTIFICATE OF CORRECTION

PATENT NO. : 11,393,511 B2
APPLICATION NO. : 17/114321
DATED : July 19, 2022
INVENTOR(S) : Xu et al.

It is certified that error appears in the above-identified patent and that said Letters Patent is hereby corrected as shown below:

In the Claims

Column 20 Line 35 Claim 11 Please delete "based at last in part on" and replace with "based at least in part on"

Column 21 Line 15 Claim 19 Please delete "based at last in part on" and replace with "based at least in part on"

Signed and Sealed this
Twenty-fifth Day of October, 2022

*Katherine Kelly Vidal*

Katherine Kelly Vidal
*Director of the United States Patent and Trademark Office*